(12) United States Patent
Vilain

(10) Patent No.: US 7,999,227 B2
(45) Date of Patent: Aug. 16, 2011

(54) ELECTROMAGNETIC RADIATION DETECTOR AND METHOD FOR MANUFACTURING SUCH A DETECTOR

(75) Inventor: Michel Vilain, Saint-Georges de Commiers (FR)

(73) Assignee: ULIS, Veurey Voroize (FR)

( * ) Notice: Subject to any disclaimer, the term of this patent is extended or adjusted under 35 U.S.C. 154(b) by 0 days.

(21) Appl. No.: 12/170,669

(22) Filed: Jul. 10, 2008

(65) Prior Publication Data
US 2009/0020702 A1    Jan. 22, 2009

(30) Foreign Application Priority Data

Jul. 20, 2007    (FR) ...................................... 07 05271

(51) Int. Cl.
*G01J 5/02*    (2006.01)
(52) U.S. Cl. .................................................. 250/338.1
(58) Field of Classification Search ............... 250/338.1
See application file for complete search history.

(56) References Cited

U.S. PATENT DOCUMENTS

| 5,912,464 | A | 6/1999 | Vilain et al. |
| 6,198,098 | B1 | 3/2001 | Laou |
| 6,495,829 | B1 * | 12/2002 | Oda ......................... 250/339.02 |
| 2001/0010360 | A1 * | 8/2001 | Oda ........................... 250/338.1 |

FOREIGN PATENT DOCUMENTS

| WO | 00/37906 A1 | 6/2000 |
| WO | WO 0037906 A1 * | 6/2000 |

* cited by examiner

*Primary Examiner* — David Porta
*Assistant Examiner* — Shun Lee
(74) *Attorney, Agent, or Firm* — Burr & Brown

(57) ABSTRACT

This electromagnetic radiation detector comprises a reflecting substrate and at least one detection element comprising a membrane sensitive to said radiation and suspended above the substrate. The distance between the membrane and at least one detection element and the substrate is variable, said distance having a predefined spatial distribution suitable for minimizing the rapid variations of a response of the radiation detector in at least one predefined wavelength range.

12 Claims, 4 Drawing Sheets

ELECTROMAGNETIC RADIATION DETECTOR AND METHOD FOR MANUFACTURING SUCH A DETECTOR

FIELD OF THE INVENTION

The present invention relates to the field of imaging. It relates in particular to the field of infrared imaging and bolometric pyrometry.

More particularly, the present invention relates to a detector comprising a reflecting substrate and at least one detection element comprising a membrane sensitive to an electromagnetic radiation, suspended above the substrate.

BACKROUND OF THE INVENTION

Bolometric detectors belong to a category of detectors comprising a matrix arrangement of unitary sensitive elements with a suspended membrane. Each of these unitary elements comprises a membrane, made absorbent to electromagnetic radiation in a predefined wavelength range and kept in suspension above a reflecting substrate by means of resistive thermal structures, which allow its heating by the effect of the radiation and its electrical connection to the substrate.

In the context of the present invention, substrate means a physical component located directly below the membrane. In general, the substrate comprises a substrate called "structural", in which an electronic read circuit is prepared from a passivation layer covering the structural substrate and a reflecting layer covering the passivation layer.

In the case of a bolometric detector, the membrane comprises a bolometric material, that is a material whose resistivity varies with the temperature thereof. The variation in resistivity of the bolometric material under the effect of a variation in temperature is then detected by an electronic read circuit prepared on the substrate.

The membrane and the substrate are generally designed essentially in planar form, and are arranged parallel to one another at a predefined distance so as to form a quarter wave gap between them. This quarter wave gap has the effect of optimizing the response of the detector by a resonance mechanism in the wavelength range of interest.

Thus, in the case of a bolometric detector intended for the observation of a thermal infrared radiation at ambient temperature, that is a radiation having a wavelength of between 8 and 14 microns, the distance between the membrane and the substrate is adjusted to about 2.5 microns. A response of the bolometric detector to the radiation wavelength is then detected as shown by the curve A in FIG. 1.

It is important to observe that in this type of detector having a membrane suspended above a reflecting substrate in order to form a resonant cavity, the response also has secondary peaks corresponding to higher interference orders. Typically, in the case of the abovementioned bolometric detector, a narrow secondary peak is observed, but having a high altitude, at about 2.5 microns, as shown on abovementioned curve A in FIG. 1.

However, in this type of detector, the wavelength range detected is restricted, due to the fact that the secondary peak or peaks are narrow and the response of the detector between the peaks is too weak for correct use.

A first approach for increasing the detection range of this type of sensor consists in using two types of juxtaposed or superimposed detection structures, each of these structures being sensitive to a given wavelength range. This type of detector is complex to manufacture, especially in the case of superimposed structures. Moreover, such detectors necessarily have reduced resolution because twice as many sensitive elements must be provided per unit surface area.

A second approach for increasing the detection range consists in using the presence of the secondary peaks in the response of the sensor. However, this approach is difficult to implement, in particular when considering the case in which the user concentrates for example on a precise wavelength (typically, the case of the detection of atmospheric pollutants), this wavelength possibly being located on the sides of a sensitivity peak, in which case slight distortions of the sensitivity spectrum from one sensitive point to the next in the same matrix detector, and between different detectors (problem of the detector manufacturer), lead to wide signal variations at this wavelength.

Thus, when the wavelength of interest falls on the side of a peak, the dispersion is normally very high. The detector is therefore inaccurate from this standpoint.

Thus, the detection on a wide wavelength range below the main peak is not reproducible because of the dispersion from one detector to another and the dispersion within a given detector.

Furthermore, also in the case in which the user concentrates on a very narrow wavelength range, the response of the detector outside the main peak and the secondary peak is generally weak. The use of the detector in wavelength ranges distant from the peaks is therefore difficult, indeed impossible.

Moreover, the use of a secondary peak consists in many cases in obtaining a bispectral detection. In fact, considering the case in which a high overall sensitivity is needed between 3 and 5 microns, while remaining sensitive between 8 and 14 microns, thereby to constitute a bispectral detection, the difficulty now is that the intrinsic variability of the spectrum of the detector's response in the range from 3 to 5 microns also results in a wide dispersion of the detector in this range, according to the spectral characteristics of the scene observed. A filter effect thus exists, favoring the wavelengths emitted by the scene on the peaks, and attenuates the wavelengths emitted by the scene in the inter-peak valleys. The detector's response is therefore relatively unrepresentative of the thermal characteristics of the scene. This response is also dispersed between detectors and on the surface of the same detector.

In the more specific case of a bolometric detector in which a resonance is obtained by a quarter wave gap, attempts have also been made, according to a third approach, to obtain an optimal detection in the middle infrared, that is in the infrared with wavelengths between 3 and 5 microns, using the main resonance peak. This approach consists of forming a quarter wave gap dedicated to such a radiation between the membrane of each sensitive element and the substrate, in order to obtain a response from the detector according to curve B in FIG. 1.

This accordingly implies the use of a submicron quarter wave gap and hence a maximum distance of less than one micron between the membrane suspended from the sensitive element and the substrate. In fact, it is difficult to obtain such a distance because this demands an adjustment with an accuracy of less than one-tenth of a micron. In fact, an error of 0.1 micron in the distance between the membrane and the substrate causes a variation of about 15 percent in the response, thereby making the use of the detector difficult.

Furthermore, this arrangement implies a significant reduction of the sensitivity of the detector in the high wavelengths.

It is the object of the present invention to solve the abovementioned problems by proposing a detector of the abovementioned type having a wide usable detection range, and which is simple to manufacture.

SUMMARY OF THE INVENTION

For this purpose, the invention relates to a detector of electromagnetic radiation comprising a reflecting substrate and at least one detection element comprising a membrane sensitive to a radiation and suspended above the substrate.

According to the invention, the distance between the membrane of the at least one detection element and the substrate is variable, said distance has a predefined spatial distribution suitable for minimizing the rapid variations of a response of the detector to the radiation in at least one predefined wavelength range.

The variation in the distance between the membrane and the substrate thereby serves to adjust the shape of a secondary peak of the representative curve of the response of the detector according to the wavelength of the radiation detected, and in particular its gradient and its amplitude, without the need to provide a resonance cavity specifically dedicated to the wavelength range corresponding to this peak.

In order to obtain such a variability of the distance in question, the substrate and/or the suspended membrane have 3D motifs.

Furthermore, the membrane and the substrate are substantially parallel in portions.

According to a particular embodiment of the invention, the distance between the suspended membrane and the substrate is distributed between at least first and second predefined values.

Furthermore, the surface areas corresponding to various distance values between the membrane and the substrate are identical or different.

According to a particular application of the detector of the invention, the suspended membrane comprises a bolometric material sensitive to a temperature variation resulting from exposure to infrared radiation, the membrane constituting it possibly being sensitive to wavelengths between about 3 micrometers and about 14 micrometers.

According to this hypothesis, the first and second distance values between the suspended membrane and the substrate are substantially equal to 3 and 2 micrometers respectively. According to this particular application, the ratio of the area of the membrane separated from the substrate by the first distance to the area of the membrane separated from the substrate by the second distance is between about 35 and about 50 percent.

According to one feature of the invention, the 3D motifs provided on the membrane and/or the substrate are repetitive, their repetition step being lower than or equal to 4 micrometers in the particular case of the preceding configuration.

The present invention also relates to a method for manufacturing a detector, of the type comprising a step of formation of a reflecting substrate and of a membrane constituting at least one detection element sensitive to a radiation, and a step of suspension of the membrane above the substrate.

According to the invention, the step of formation of the substrate and of the membrane comprises a step of creation of 3D motifs in the substrate and/or the membrane, so that the predefined spatial distribution is suitable for minimizing the rapid variations of a response of the radiation detector in at least one predefined wavelength range.

BRIEF DESCRIPTION OF THE DRAWINGS

The invention will be better understood from a reading of the description that follows, provided exclusively as an example, and in conjunction with the appended drawings, in which identical numerals denote identical or similar elements, and in which.

DETAILED DESCRIPTION OF THE INVENTION

Figure 2:
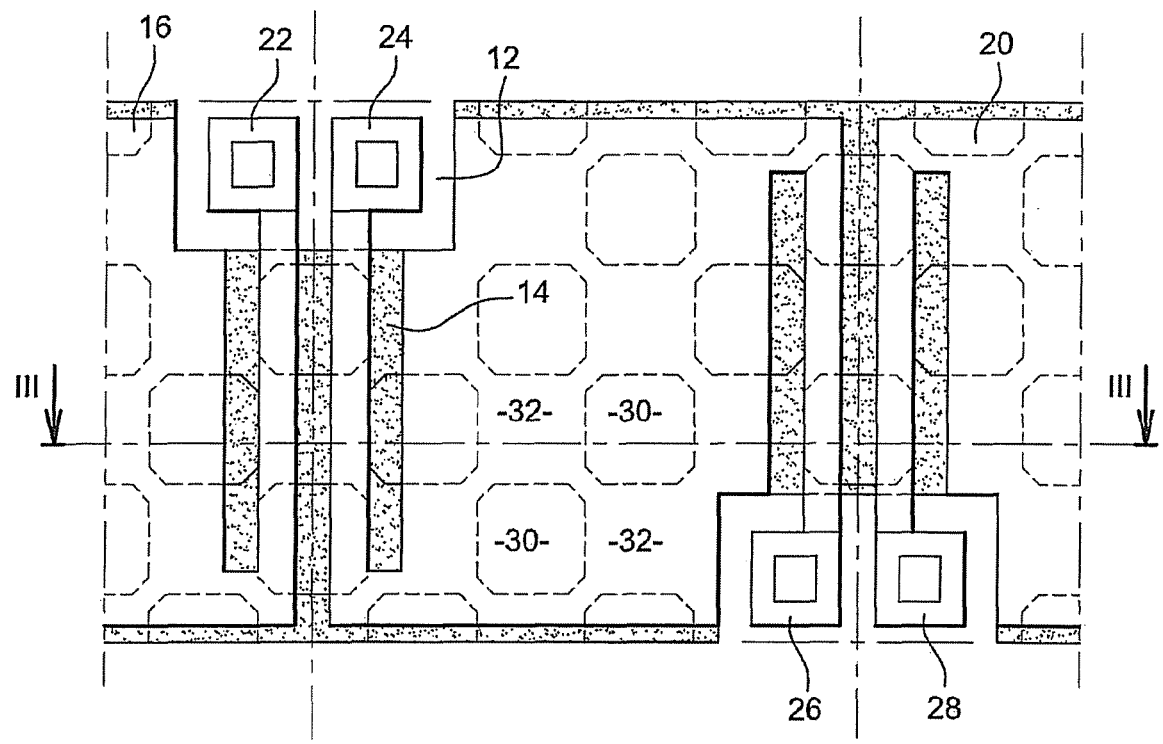
FIG. 2 is a schematic plan view of a first embodiment of a bolometric detector according to the invention.
Figure 3:
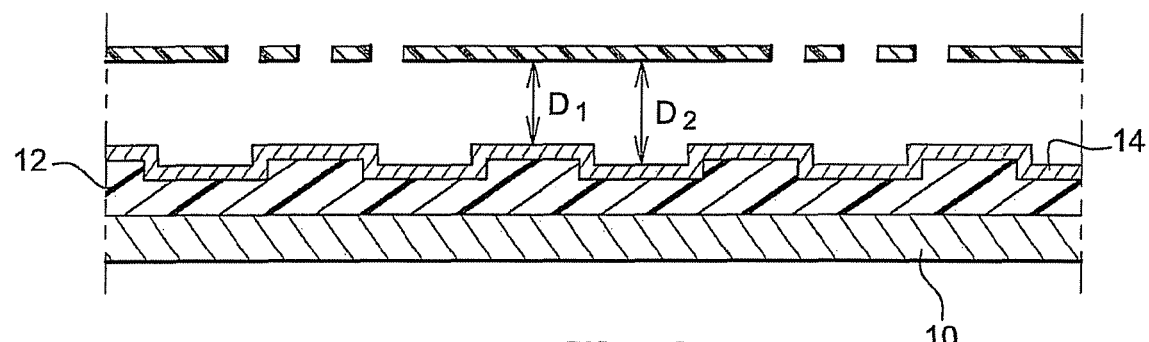
FIG. 3 shows a section of the detector in FIG. 2 along plane III-III of this figure.

FIGS. 2 and 3 show a bolometric detector according to the invention, dedicated to the detection of thermal and middle infrared radiation. This detector comprises a structural substrate 10, substantially plane, in which an electronic read circuit (not shown), well known per se, is prepared.

This detector also comprises a passivation layer 12 covering the structural substrate 10, having a thickness of 1 to a few microns, and prepared from a dielectric material. The passivation layer 12 is optionally covered with an additional layer (not shown) of dielectric material, such as a silicon oxide, a silicon nitride or a mixed material, for example silicon oxynitride.

For various reasons, the passivation of electronic circuits is conventionally formed of several layers which should in general not be modified during a subsequent cavity formation process, to avoid the risk of modifying their passivating character, at least locally. Advantageously, the addition of the additional layer, of a type compatible with the underlying passivation layers, serves to form a texturization therein by etching, without thereby modifying the characteristics of the read circuit.

A metal reflecting layer 14, having a thickness of between 0.3 and 1 micron, is also provided and covers the passivation layer 12.

Finally, the detector comprises a plurality of identical elementary bolometric membranes 16, 18, 20, arranged uniformly in matrix form, for example with a repetition step of between 25 and 40 microns. These membranes 16, 18, 20 are substantially planar and are suspended above the reflecting layer 14 by means of suspension arms 22-28.

Each membrane 16, 18, 20 has a low thickness, of a few tenths of a micron, and comprises a bolometric material, such as for example amorphous silicon (a-Si), vanadium oxide, (VOx) or a metal oxide (Ti).

The membrane 16, 18, 20 also has a high absorption capacity to wavelengths between about 3 microns and about 14 microns.

Furthermore, the absorption capacity of the membrane 16, 18, 20 in this range is substantially independent of the first order of the wavelength of the incident radiation. For this purpose, the membrane comprises a metal layer (not shown), of which the layer resistance is between about 300 Ohms per square and about 400 Ohms per square. The membrane is for example of the type described in document FR 2 796 148

The arrangement of the structural substrate 10, the passivation layer 12, the reflecting layer 14 and a membrane 16, 18, 20 constitutes a unitary sensitive element of a matrix arrangement of the detector, as known per se.

In operation, the reflecting layer 14 reflects toward the absorbent membrane 16, 18, 20 an infrared flux having passed through it without having been absorbed, thereby increasing the overall absorption capacity of the detector by a resonance mechanism.

According to the invention, the passivation layer 12 comprises staged 3D motifs 30, 32, having surfaces parallel to the membranes 16, 18, 20 formed on the surface of the passivation layer 12 oriented toward the membranes 16, 18, 20 and covered by the metal reflecting layer 14.

These staged 3D motifs 30, 32 are uniformly distributed at a distance D1 and a distance D2 from the membranes 16, 18, 20. Preferably, the distances D1 and D2 are substantially equal to 3 and 2 micrometers, respectively.

Furthermore, the ratio of the surfaces between the motifs separated from the membranes by the distance D1 and the motifs separated from the membranes 16, 18, 20 by the distance D2 is selected to be substantially equal to 40%. This proportion represents a favorable case in this particular exemplary embodiment, but in no way constitutes a preferable typical proportion.

Thus, it may be observed that a cavity defined by the membrane 16, 18, 20 of a unitary sensitive element and the 3D motifs 30 separated by the distance D1 forms a quarter wave gap for the 8 micrometers wavelength. The response of the sensitive element is therefore amplified for a wavelength range of between substantially 8 and substantially 14 microns.

Similarly, a cavity defined by the membrane and the 3D motifs 32 separated by the distance D2 forms a quarter wave gap for the 12 micrometers wavelength. The response of the sensitive element is therefore amplified for a wavelength range of between substantially 6 and substantially 12 microns.

Thus, within each unitary sensitive element of the detector, the distance between the membrane 16, 18, 20 of the element and the metal reflecting layer 14 is variable. This internal variability of the element serves to adjust the contribution of each quarter wave gap to the overall response of the sensitive unitary element.

Figure 4:
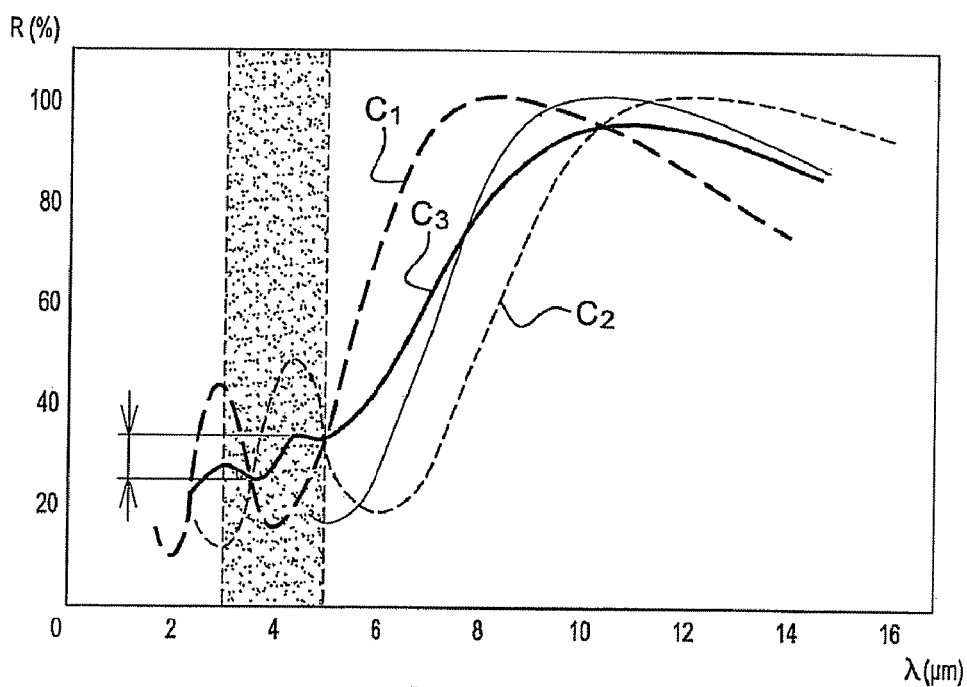
FIG. 4 is a graph of standardized response curves of a bolometric detector according to the first embodiment of the invention.

FIG. 4 illustrates this phenomenon for the detector thus described. In this figure, the contribution of the motifs 30 separated from the membranes 16, 18, 20 by the distance D1 of 2 microns is represented by the curve C1, and the contribution of the motifs 32 separated from the membranes 16, 18, 20 by the distance D2 of 3 microns is represented by the curve C2. The overall response of the detector is shown by the curve C3.

As may be observed for the middle infrared, the choice of the distances D1 and D2 and the surface ratio has the effect that the minimum of the curve C1 corresponds substantially to the maximum of the curve C2, and vice versa. Therefore, due to the combination of the contributions of the two types of 3D motifs, the overall response C3 of the detector for the middle infrared has a reduced variability which makes the detection of the middle infrared more easily usable.

Figure 1:
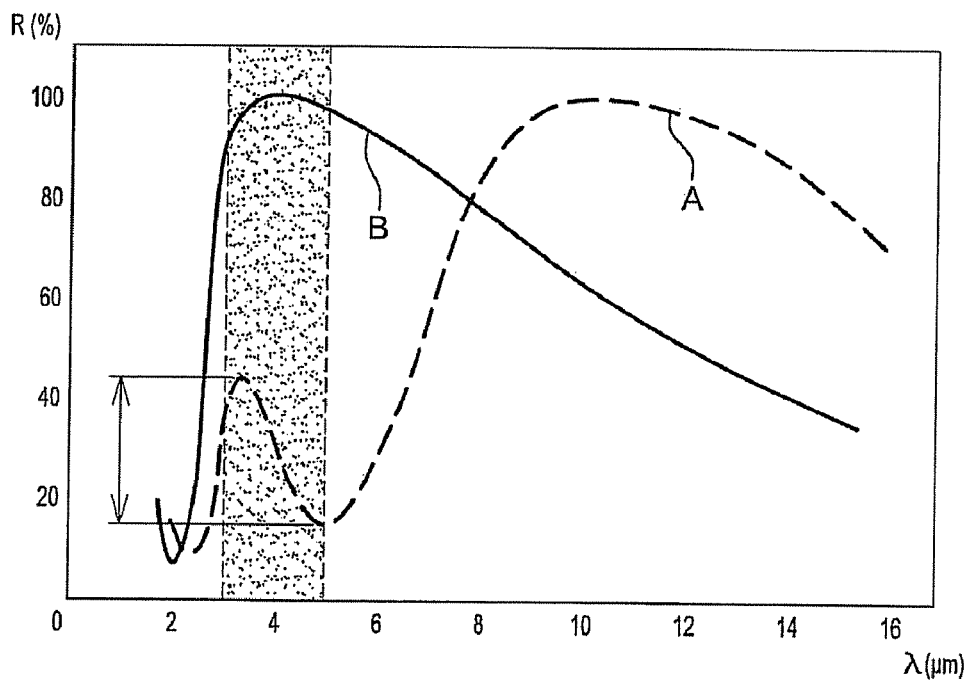
FIG. 1 is a graph of standardized response curves of detectors of the prior art.

Furthermore, the average level of the detector response between the middle infrared and the thermal infrared, that is the response of the detector in the range from 5 microns to 8 microns, is increased. Accordingly, this detector is suitable for using a continuous wavelength range between about 3 microns and 14 microns, unlike a prior art detector having the response as shown in curve A (FIG. 1).

It may also be observed that to obtain a usable detection in the middle infrared, it is unnecessary to fabricate submicron cavities. In fact, the shortest distance D1 is equal to about 2 microns.

Furthermore, it should also be observed that the fact of making the detector usable in the middle infrared is accompanied in the first embodiment by a minimal loss of detection capacity in the thermal infrared. In fact, the overall response in the range from 8 microns to 14 microns is 5% lower than the overall response of the prior art illustrated by curve A in FIG. 1.

Preferably, a 3D motif repetition step is selected in order to avoid diffraction mechanisms, which are detrimental to the quality of the detector response in the wavelength range of interest. For the detector according to the first embodiment, this repetition step is lower than 4 microns to avoid degrading the quality of the response between 3 and 14 microns.

Preferably, during the manufacture of the detector, the motifs are formed by means of a texturization of the passivation layer 12 by local and partial etching of a free surface thereof (that is before the deposition of the reflecting layer 14), using a lithographic mask corresponding to the 3D motifs 30, 32.

It may be observed that the passivation layer 12 can actually be formed of several layers. As previously mentioned, in the case in which the texturizing is obtained in the passivation layer, this texturizing does not degrade the passivating character of the layer 12. Advantageously, an additional passivation layer is added, this layer being the one undergoing the texturizing, so that the passivating character of the underlying layers is preserved. Obviously, in the case in which the conventional passivation layer(s) may undergo the texturization without degradation of their passivating character, the additional layer can be omitted.

Although a texturization of the surface of the passivation layer 12 has been described, it may be understood that other texturizations are possible. For example, the 3D motifs are formed in the structural substrate 10, the successive deposition of the other layers being uniform in order to ultimately reveal the motifs opposite the membranes 16, 18, 20.

A particular embodiment has been described of a bolometric detector having a suspended membrane intended for detecting a wide infrared range thanks to a particular selection of staged 3D motifs formed in the surface of a reflecting substrate.

The overall response of the detector is partly produced by the variability of the distance between the membrane of a sensitive unitary element and the substrate. Other features serve to adjust the contribution of each type of motif to the overall response of the detector, particularly the reflecting power of each type of motif.

In fact, adjusting the reflecting power of one type of motif adjusts its contribution to the overall response of the detector.

Figure 5:
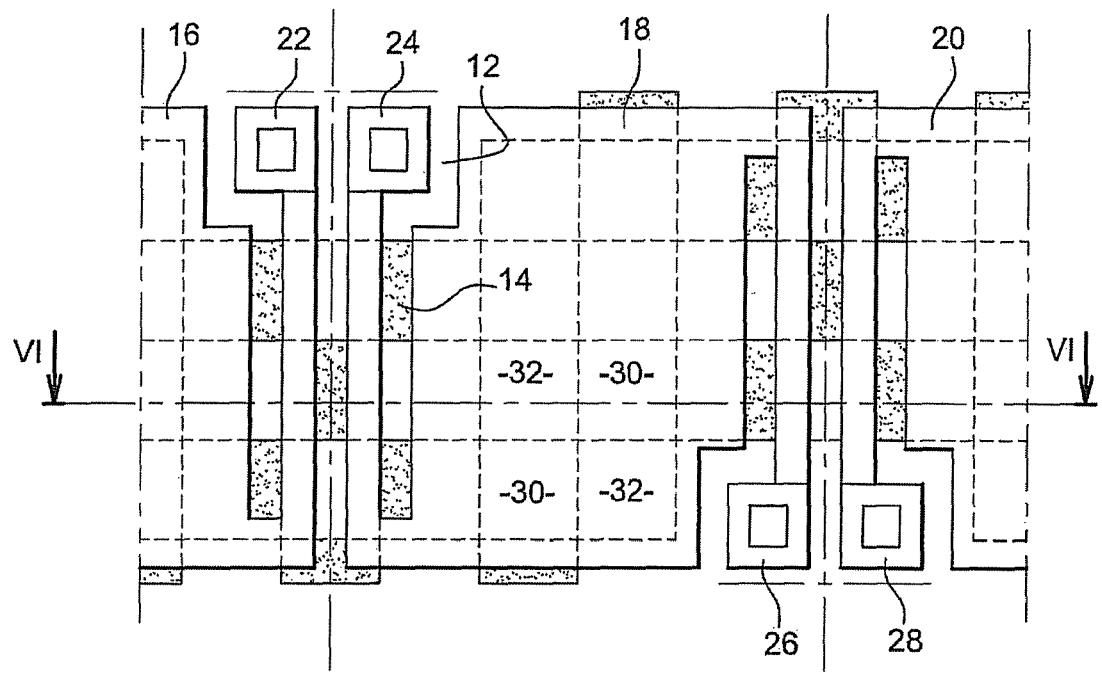
FIG. 5 is a schematic plan view of a second embodiment of a bolometric detector according to the invention.
Figure 6:
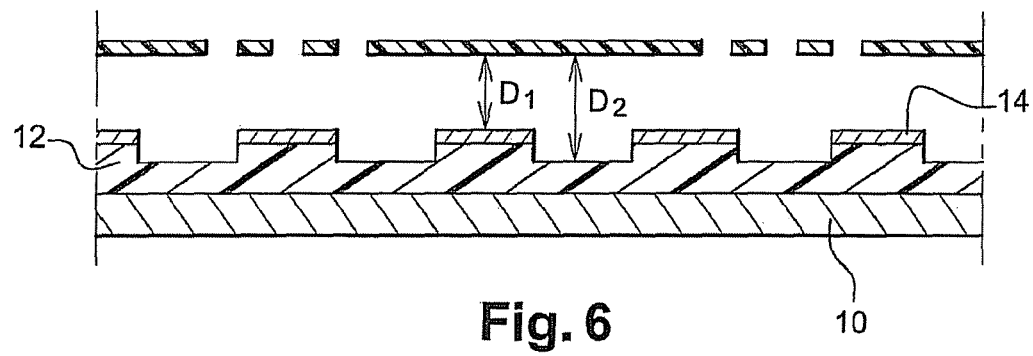
FIG. 6 shows a section of the detector in FIG. 5 along plane VI-VI of this figure.

For example, a second embodiment, illustrated in FIGS. 5 and 6, is similar to the one described in FIGS. 2 and 3, with the difference that only the motifs 30 separated from the membranes by the shorter distance D1, are covered by the reflecting layer 14. Normally, the passivation layer 12 has a non-zero reflecting power, but lower than that of the layer 14. Accordingly, the contribution of the most distant motifs 32 is reduced. This has the effect on the one hand of offering an additional means for adjusting the respective reflecting powers, and hence the resulting sensitivity spectrum of the detector, but also, very advantageously, economizing a lithographic level during the manufacture of the structure. In fact, for the embodiment or embodiments in which the reflector extends on the whole reflecting surface, one lithographic level has to be used to define the texturizing, and another lithographic level to delimit the contours of the reflector (if not all the structures would be short-circuited). In the advantageous case discussed, the lithographic level necessary for defining the reflector is used simultaneously to define the texturizing of the reflecting surface. The process is simplified and therefore more economical.

Similarly, the ratio of the surfaces between the various motifs serves to adjust the contribution of each type of motif. Thus to obtain a bolometric detector intended for detecting the middle infrared, the surface ratio between the motifs separated from the membranes by the distance D1 and the motifs separated from the membranes 16, 18, 20 by the distance D2 is between about 35% and about 65% according to the type of response desired.

For example, the second embodiment differs from the first embodiment in that the 3D motifs are arranged in a regular checkerboard. The ratio of the areas of the two types of motif is thus substantially equal to 50%. This figure is provided as an example, and is not preferable.

Figure 7:
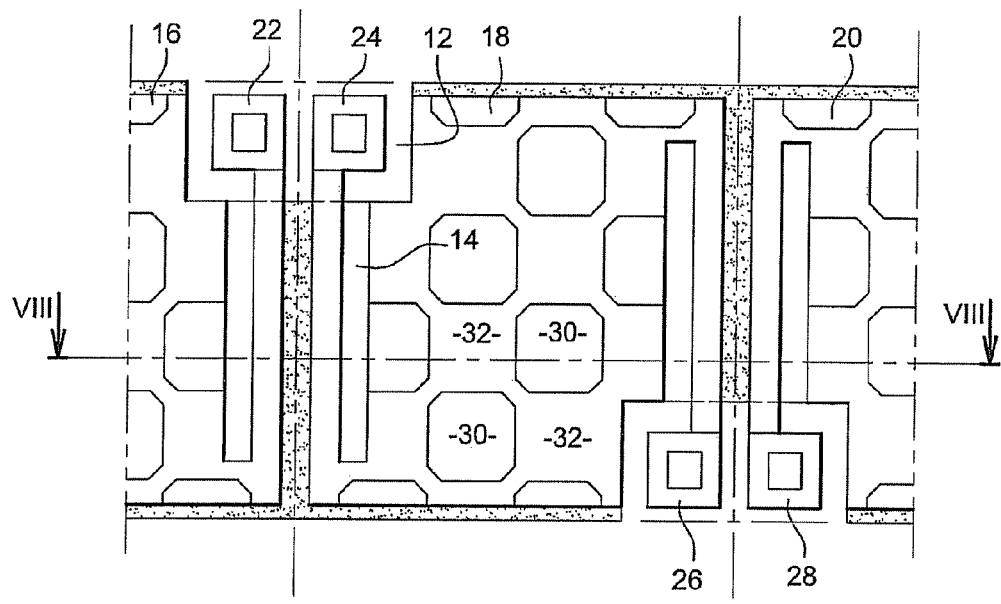
FIG. 7 is a schematic plan view of a third embodiment of a bolometric detector according to the invention.
Figure 8:
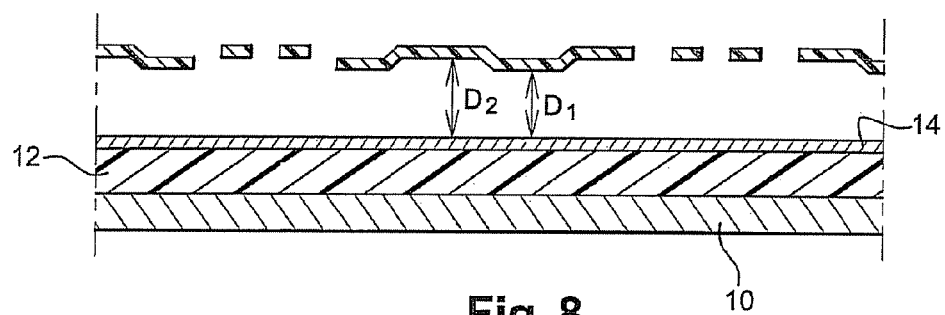
FIG. 8 shows a section of the detector of FIG. 7 along plane VIII-VIII of this figure.

Although embodiments have been described in which the variability of the distance is obtained by the formation of 3D motifs in the substrate, as an alternative, this variability is obtained by the formation of 3D motifs in the membranes, as shown in FIGS. 7 and 8.

This third embodiment is similar to the previous ones, with the difference that the motifs, having identical shapes and dimensions to those of the first embodiment described in relation to FIGS. 2 and 3, are formed in the membranes.

One advantage of forming the motifs in the membranes and not in the substrate is that the sensitivity of the detector to diffraction mechanisms appearing on the 3D motifs in the substrate is substantially eliminated. One disadvantage is more complicated manufacture. In fact, the formation of motifs in the substrate is easier.

As an alternative, the 3D motifs are formed both in the substrate and the membranes, for example to obtain a compromise between ease of construction and attenuation of diffraction mechanisms.

Although embodiments have been described in which substantially planar motifs form cavities with parallel surfaces, other types of motifs can be used. As an alternative, the surface of the substrate and/or the membrane has a wavy profile, for example like a sine wave.

It will obviously be understood that the variability of the distance between the membranes and the reflecting substrate is dictated by the type of application intended and the intrinsic features of the detector.

The present invention finds a particular application in the field of image sensors with bolometric detection, regardless of the detection frequency band or the type of bolometric material used to manufacture the imaging and reference bolometers, like for example amorphous silicon (a-Si), vanadium oxide (VOx), or metal oxide (Ti).

The invention claimed is:

1. A detector of electromagnetic radiation comprising a reflecting substrate and at least one detection element comprising a bolometric membrane sensitive to said radiation and suspended above the substrate, wherein the distance between the bolometric membrane of the at least one detection element and the substrate is variable, said distance having a predefined spatial distribution that defines quarter wave cavities to amplify said radiation in a first wavelength of 8-14 µm and minimizes a relative amplitude of variations of a response of the detector to the radiation in a second wavelength range of 3-5 µm without defining a resonance cavity to amplify said radiation in the second wavelength range.

2. The electromagnetic radiation detector as claimed in claim 1, wherein the substrate and/or the bolometric membrane have 3D motifs.

3. The electromagnetic radiation detector as claimed in claim 2, wherein the 3D motifs are repetitive, and in that their repetition step is lower than or equal to 4 micrometers.

4. The electromagnetic radiation detector as claimed in claim 1, wherein the bolometric membrane and the substrate are substantially parallel in portions.

5. The electromagnetic radiation detector as claimed in claim 4, wherein the distance between the bolometric membrane and the substrate is distributed between at least first and second predefined values.

6. The electromagnetic radiation detector as claimed in claim 4, wherein the surface areas corresponding to various distance values between the bolometric membrane and the substrate are identical or different.

7. The electromagnetic radiation detector as claimed in claim 1, wherein the bolometric membrane comprises a bolometric material sensitive to a temperature variation resulting from exposure to infrared radiation.

8. The electromagnetic radiation detector as claimed in claim 7, wherein the bolometric membrane is sensitive to wavelengths between about 3 micrometers and about 14 micrometers.

9. The electromagnetic radiation detector as claimed in claim 7, wherein the first and second distance values are substantially equal to 3 and 2 micrometers respectively.

10. The electromagnetic radiation detector as claimed in claim 9, wherein the ratio of the area of the bolometric membrane separated from the substrate by the first distance to the area of the bolometric membrane separated from the substrate by the second distance is between about 35 and about 65 percent.

11. The electromagnetic radiation detector as claimed in claim 7, wherein the 3D motifs are repetitive, and in that their repetition step is lower than or equal to 4 micrometers.

12. A method for manufacturing an electromagnetic radiation detector, of the type comprising a step of formation of a reflecting substrate and of a bolometric membrane, of at least one detection element sensitive to a radiation, and a step of suspension of the bolometric membrane above the substrate, wherein the step of formation of the substrate and of the bolometric membrane comprises a step of creation of 3D motifs in the substrate and/or the bolometric membrane, so that the distance between the substrate and the bolometric membrane having a predefined spatial distribution that defines a quarter wave cavity to amplify said radiation in a first wavelength range of 8-14 µm and minimizes a relative amplitude of variations of a response of the radiation detector in a second wavelength range of 3-5 µm without defining a resonance cavity to amplify said radiation in the second wavelength range.

* * * * *